(12) United States Patent      (10) Patent No.: US 8,279,660 B2
Perisetty      (45) Date of Patent: Oct. 2, 2012

(54) STATIC RANDOM-ACCESS MEMORY WITH BOOSTED VOLTAGES

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/101,807

(22) Filed: May 5, 2011

(65) Prior Publication Data

US 2011/0211384 A1    Sep. 1, 2011

Related U.S. Application Data

(62) Division of application No. 12/134,138, filed on Jun. 5, 2008, now Pat. No. 7,957,177.

(51) Int. Cl.
*G11C 11/00* (2006.01)
(52) U.S. Cl. ................. 365/154; 365/156; 365/226
(58) Field of Classification Search .............. 365/154, 365/156, 226, 189.02
See application file for complete search history.

(56) References Cited

U.S. PATENT DOCUMENTS

| | | | |
|---|---|---|---|
| 5,025,417 A | 6/1991 | Miyamoto et al. | |
| 5,122,846 A | 6/1992 | Haken | |
| 5,214,327 A | 5/1993 | Saeki et al. | |
| 5,432,467 A | 7/1995 | Reddy | |
| 5,642,315 A | 6/1997 | Yamaguchi | |
| 5,715,191 A * | 2/1998 | Yamauchi et al. | 365/156 |
| 5,757,702 A | 5/1998 | Iwata et al. | |
| 5,801,551 A | 9/1998 | Lin | |
| 5,920,201 A | 7/1999 | Mehrotra et al. | |
| 6,114,843 A | 9/2000 | Olah | |
| 6,232,893 B1 | 5/2001 | Cliff et al. | |
| 6,404,670 B2 | 6/2002 | Shau | |
| 6,433,585 B1 | 8/2002 | Patel et al. | |
| 6,724,222 B2 | 4/2004 | Patel et al. | |
| 6,795,332 B2 | 9/2004 | Yamaoka et al. | |
| 6,891,745 B2 | 5/2005 | Liaw | |
| 6,897,679 B2 | 5/2005 | Cliff et al. | |
| 6,995,584 B1 | 2/2006 | Nguyen et al. | |
| 7,277,351 B2 | 10/2007 | Liu et al. | |
| 7,859,301 B2 | 12/2010 | Vest et al. | |
| 2001/0038552 A1 | 11/2001 | Ishimaru | |
| 2004/0093529 A1 | 5/2004 | Devlin et al. | |
| 2007/0041242 A1 | 2/2007 | Okazaki et al. | |
| 2007/0109017 A1 | 5/2007 | Liu et al. | |
| 2007/0113106 A1 | 5/2007 | Liu et al. | |
| 2007/0258313 A1 | 11/2007 | Yu et al. | |
| 2008/0117666 A1 * | 5/2008 | Russell et al. | 365/154 |
| 2008/0198679 A1 | 8/2008 | Lysinger et al. | |

* cited by examiner

*Primary Examiner* — Huan Hoang
(74) *Attorney, Agent, or Firm* — Treyz Law Group; David C. Kellogg; G. Victor Treyz

(57) ABSTRACT

Dual port memory elements and memory array circuitry that utilizes elevated and non-elevated power supply voltages for performing reliable reading and writing operations are provided. The memory array circuitry may contain circuitry to switch a power supply line of a column of memory elements in the array to an appropriate power supply voltage during reading and writing operations. Each memory element may contain circuitry to select between power supply voltages during reading and writing operations. During reading operations, an elevated voltage may power cross-coupled inverters that store data in the memory elements while a non-elevated voltage may be used to turn on associated address transistors. During writing operations, the non-elevated voltage may power the cross-coupled inverters while the elevated voltage may be used to turn on the associated address transistors.

10 Claims, 12 Drawing Sheets

STATIC RANDOM-ACCESS MEMORY WITH BOOSTED VOLTAGES

This application is a division of patent application Ser. No. 12/134,138, filed Jun. 5, 2008, now U.S. Pat. No. 7,957,177 which is hereby incorporated by reference herein in its entirety.

BACKGROUND

This invention relates to integrated circuits with random-access memory elements, and more particularly, to integrated circuits with static random-access-memory elements that use elevated voltages.

Integrated circuits often contain memory elements. Static random-access memory elements may be based on cross-coupled inverters and may be used to store data. Each memory element may store a single bit of data. Memory elements are typically arranged in arrays. Dual port memory elements allow reading and writing operations to be performed on two separate ports.

Dual port memory arrays are used in integrated circuits such as integrated circuit memories and programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices generally contain arrays of static random-access memory (RAM). These memory arrays, which are sometimes referred to as embedded array blocks (EABs) are used to handle the storage needs of the circuitry on the device. During normal operation of a programmable logic device, the hardwired and programmable circuitry of the device performs read and write operations on the memory of the blocks. Memory arrays on a programmable logic device typically range in size from a few kilobits to about a megabit or more.

Integrated circuits such as programmable logic devices are often configured to implement memory-based circuits such as clock conversion first-in-first-out (FIFO) circuits. In a typical scenario, data is written into a FIFO using one clock signal and is read out of the FIFO using another clock signal.

Circuits such as FIFO circuits on programmable logic devices are implemented using dual port random-access-memory arrays. Dual port memory arrays are also used in application specific integrated circuits and stand-alone memory chips.

Dual port memory arrays have two independent ports, which can be used for read and write operations. On programmable logic device integrated circuits with dual port memory arrays, programmable logic circuitry and a dual port memory array can be configured to implement a FIFO. One of the dual port memory array's ports is used for write operations, while the other of the dual port memory array's ports is used for read operations.

Dual port memory arrays contain rows and columns of memory cells. Dual port memory array cells are accessed using word lines and bit lines. Because there are two ports associated with each cell, there are two sets of word lines and two sets of bit lines associated with each memory array.

In modern integrated circuit designs, care must be taken to design memory element cells so that they consume relatively small amounts of circuit real estate. At the same time, memory elements must be designed so that operations on the memory elements can be performed reliably. These design requirements sometimes pose challenges for a circuit designer. For example, to ensure that read operations are performed reliably, it may be desirable to provide a memory element with relative large transistors in the cross-coupled inverters. Making the transistors in the cross-coupled inverters strong helps to ensure that precharged data lines do not cause the memory element to flip states during a read operation. At the same time, use of overly large transistors in the memory element may consume undesirably large amounts of real estate on an integrated circuit.

It would therefore be desirable to provide improved memory elements.

SUMMARY

In accordance with the present invention, integrated circuits are provided that contain static random-access memory elements such as dual port static random-access memory elements that use elevated power supply voltages. The memory elements may be used on an integrated circuit such as an application specific integrated circuit, a memory chip, or a programmable logic device integrated circuit. The memory elements may be formed in an array. Each memory element may contain a pair of cross-coupled inverters that serve as a bistable data storage circuit. The integrated circuit may have read-write control circuitry with address decoder circuitry and data register circuitry that are used for data writing and data reading operations. During data writing operations, data may be loaded into the memory elements of the array. During data reading operations, data may be read out of the array.

The cross-coupled inverters in each memory element may be selectively powered by either an elevated power supply voltage or a non-elevated power supply voltage depending on the operation of each memory element. For example, during data reading operations, the cross-coupled inverters may be powered with the elevated power supply voltage. During data writing operations, the cross-coupled inverters may be powered with the non-elevated power supply voltage (e.g., a core logic power supply voltage).

With one arrangement, address register circuitry in the integrated circuit may generate write enable signals that control a multiplexer that provides the power supply signals for a particular column of memory elements in the array of memory elements. During data writing operations on a memory element, the address register circuitry may generate a high write enable signal (i.e., the write enable signal may be asserted) to direct the multiplexer to provide the non-elevated power supply voltage to the column of the array associated with the memory element. As a result, the cross-coupled inverters associated with that column will be powered by the non-elevated voltage. During data reading operations on a column of memory elements, the address register circuitry may generate a low write enable signal (e.g., a write disable signal may be asserted or the write enable signal may be deasserted) to direct the multiplexer to provide the elevated power supply voltage to the column of memory elements.

With another suitable arrangement, power supply circuitry associated with each memory element may receive the elevated power supply voltage and the non-elevated power supply voltage. This power supply circuitry may use word line signals to select the appropriate power signal for each element. For example, during data reading operations, a word line signal may be provided at the non-elevated voltage. The power supply circuitry may response to this word line signal by coupling the elevated voltage to the power supply terminal of the cross-coupled inverters. During data writing operations, the word line signal may be at the elevated voltage. The power supply circuitry may respond to the elevated word line signal by providing the non-elevated voltage to the inverters.

During data reading operations, the address register circuitry generates word line signals on certain word lines to access desired memory elements. Each memory element may have an address transistor that is turned on by logic high signals on an associated word line. During data reading operations, the word line signals may be at the non-elevated power supply voltage and may be used to turn on the address transistors associated with each memory element.

Before data reading operations, bit lines associated with the memory elements may be precharged (e.g., to the non-elevated power supply voltage). During data reading operations, the data register circuitry may determine the state of a particular memory element by determining whether its associated bit line or its associated inverted bit line is pulled low (e.g., by being coupled to ground by one of its inverters).

During data writing operations, the data register circuitry may be used to drive data signals into the cross-coupled inverters over associated bit lines while the address register circuitry generates word line signals that make up a write address. The word line signals may be provided at the elevated power supply voltage.

The use of elevated address lines (e.g., word lines) during write operations and the use of an elevated memory element power supply voltage during read operations helps ensure proper operation of the memory element array.

Further features of the invention, its nature and various advantages will be more apparent from the accompanying drawings and the following detailed description of the preferred embodiments.

DETAILED DESCRIPTION

The present invention relates to static random-access memory circuitry. The memory circuitry of the present invention may be used in any suitable integrated circuit. For example, the memory circuitry may be used in an integrated circuit memory device or an application specific integrated circuit (ASIC). The memory circuitry may also be used in a programmable logic device integrated circuit or a programmable integrated circuit of a type that is not traditionally referred to as a programmable logic device such as a digital signal processor containing programmable logic or a custom integrated circuit containing regions of programmable logic. The present invention will sometimes be described in the context of integrated circuits such as programmable logic device integrated circuits as an example.

Figure 1:
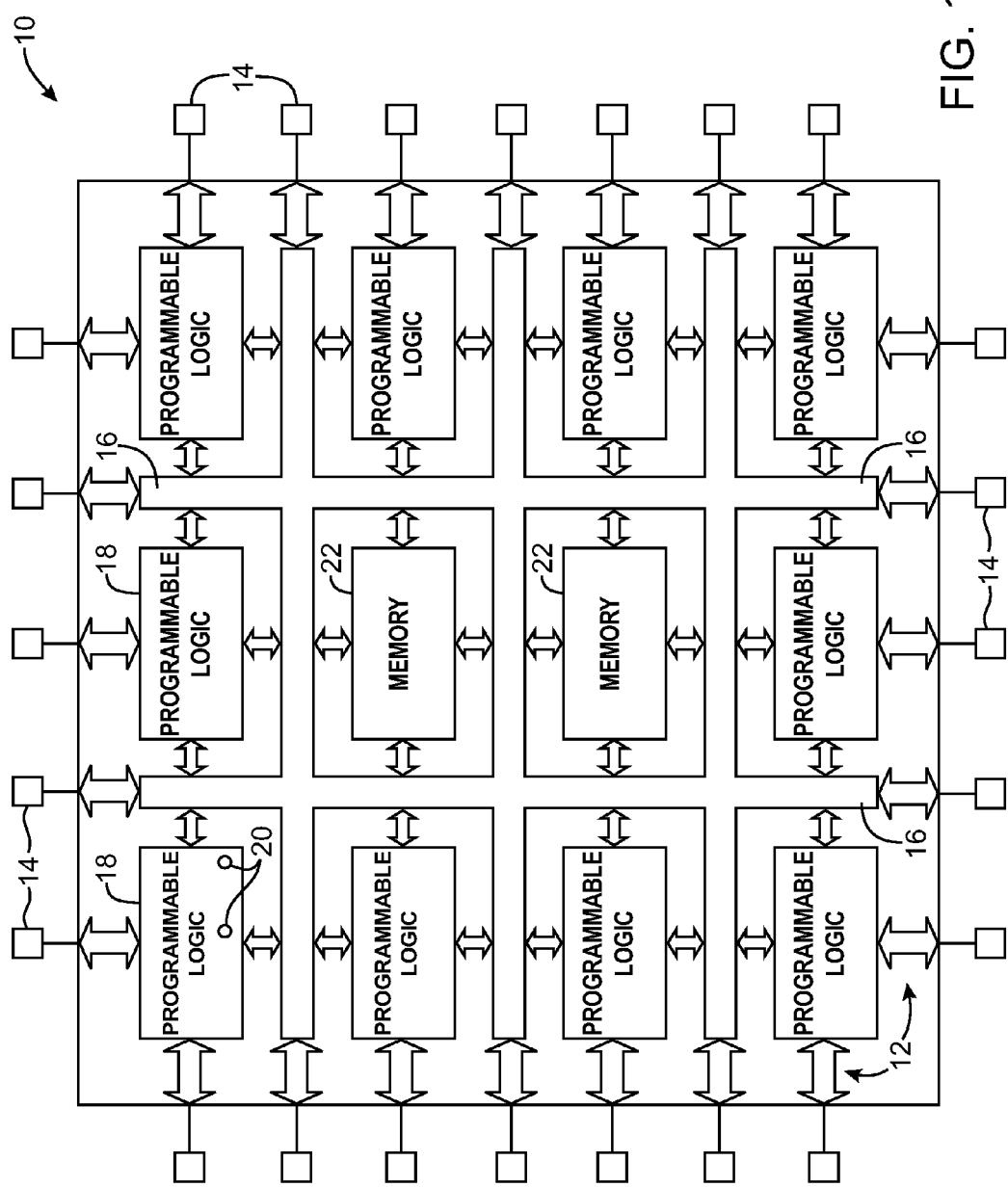
FIG. 1 is a diagram of an illustrative programmable logic device integrated circuit in accordance with an embodiment of the present invention.

An illustrative integrated circuit such as a programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory arrays 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 may contain programmable memory elements 20. Memory elements 20 can be loaded with configuration data (also called programming data) using pins 14 and input/output circuitry 12. Once loaded, the memory elements may each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory.

Memory arrays 22 contain volatile memory elements such as static random-access-memory (SRAM) cells. The memory arrays 22 are used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, two to nine large memory arrays each having a capacity of about half of a megabit, and an intermediate number of medium size memory arrays each having a capacity of about 4 kilobits to 8 kilobits. These are merely illustrative memory block sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Memory 22 may include signal port and/or dual port memory. The use of memory 22 that includes dual port arrays in described herein as an example. A dual port memory array 22 has two independent ports for writing and reading data. In a typical scenario, logic such as user logic that is implemented from a portion of programmable logic 18 generates data. The data is stored in a dual port memory array 22. Data is stored by writing the data into memory cells at a particular address within the memory array. The stored data can be accessed by performing a read operation. Because the memory array has two ports, one port may be used to perform read or write operations at the same time that the other port is being used to perform read or write operations. Separate clocks may be used for each port.

Figure 2:
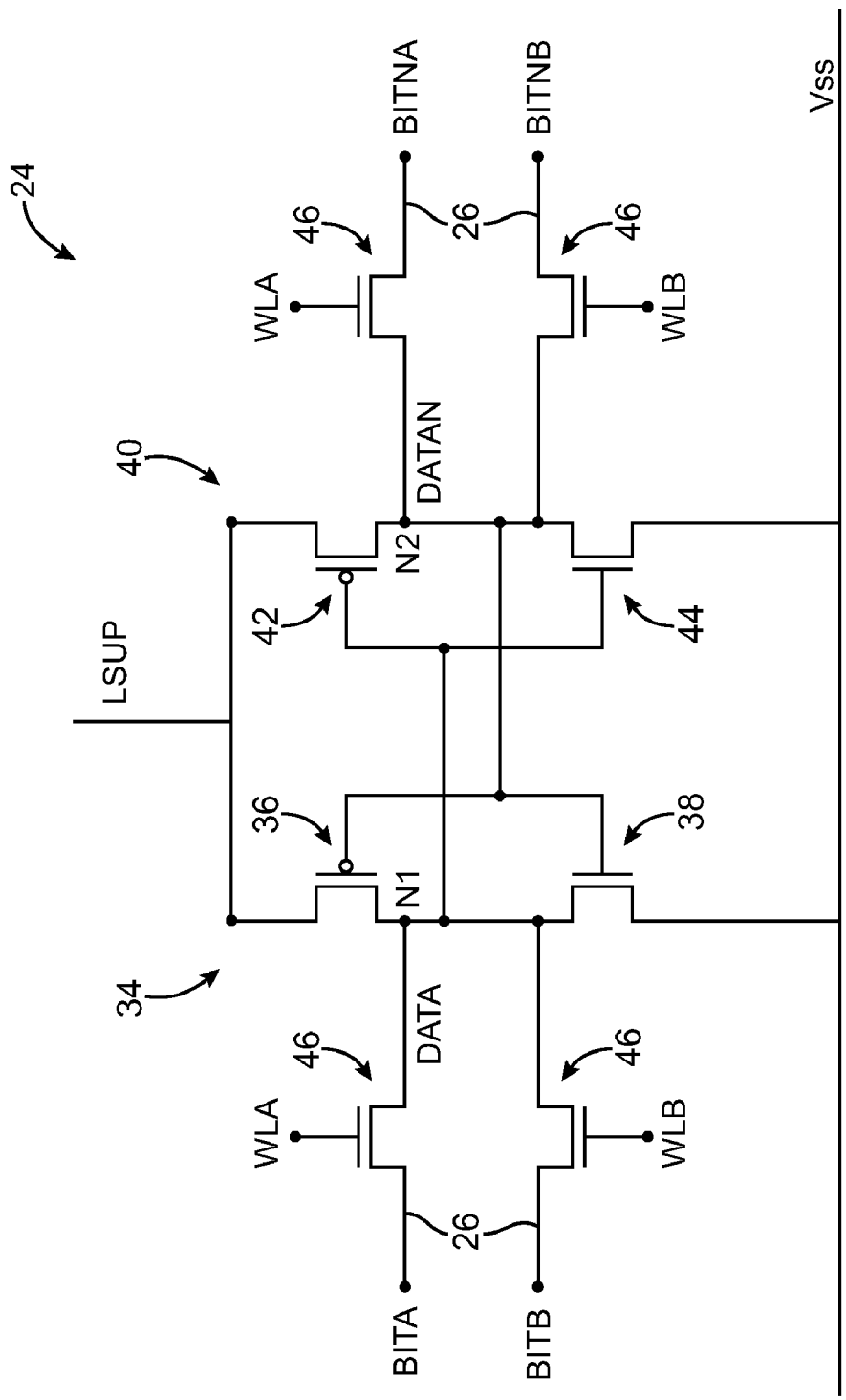
FIG. 2 is a diagram of an illustrative memory element that may be powered with an elevated power supply voltage in accordance with an embodiment of the present invention.

An illustrative memory element 24 of the type that may be used in an array of memory elements such as array 22 in accordance with an embodiment of the present invention is shown in FIG. 2. As shown in FIG. 2, memory element 24 may be formed from two cross-coupled inverters such as inverters 34 and 40. Inverter 34 has p-channel metal-oxide-semiconductor (PMOS) transistor 36 and n-channel metal-oxide-semiconductor (NMOS) transistor 38. Inverter 40 has PMOS transistor 42 and NMOS transistor 44. The inverters 34 and 40 are powered with a latch power supply voltage LSUP and a ground power supply voltage Vss.

The latch power supply voltage may vary with time in accordance with the desired operation of memory element 24. For example, during reading operations LSUP may be an elevated power supply voltage (e.g., Vcchg) and during writing operations LSUP may be a non-elevated power supply voltage (e.g., a core logic voltage of Vcc). In a typical integrated circuit, Vcchg may be 1.5 volts, Vcc may be 1.0 volts, and Vss may be 0 volts. In general, any suitable values of Vcchg, Vcc, and Vss may be used.

Memory cell 24 has four associated bit lines 26. During read operations through port A, data is read out of memory cell 24 over complementary bit lines BITA and BITNA and is sensed using associated differential sense amplifier circuitry. During write operations through port A, data on bit lines BITA and BITNA is loaded into memory cell 24. Similarly, data is read out of memory cell 24 over complementary bit lines BITB and BITNB during read operations through port B. During write operations through port B, data on bit lines BITB and BITNB is loaded into memory cell 24.

Memory cell 24 has four address transistors 46. One pair of address transistor 46 is controlled by the word line for port A (WLA) and is associated with port A. The other pair of address transistors 46 is controlled by the word line for port B (WLB) and is associated with port B. When WLA is asserted, the gates of the port A address transistor go high and the port A address transistors are turned on. With the port A transistors turned on, the bit lines BITA and BITNA are connected to nodes N1 and N2, respectively. When WLB is asserted, the gates of the port B address transistors go high and the port B address transistors are turned on. With the port B address transistors turned on, the bit lines BITB and BITNB are connected to nodes N1 and N2, respectively.

As shown in FIG. 2, the signal on node N1 is labeled "DATA" and represents the contents of memory cell 24, whereas the signal on node N2 is labeled "DATAN" and represents the inverse of the signal DATA. When a logic one is stored in cell 24, node N1 is high (e.g., at the voltage of LSUP) and node N2 is low (e.g., Vss). When a logic zero is stored in cell 24, node N1 is low and node N2 is high.

During a read operation, the latch power supply voltage LSUP is at an elevated power supply voltage (e.g., Vcchg) and the two address transistors associated with a given port are turned on by a non-elevated power supply voltage (e.g., Vcc), so that the contents of the cell may be sensed over a differential bit line pair 26. For example, during a read operation on port A, word line signal WLA is asserted (with Vcc), which turns on the port A address transistors, so that signals DATA and DATAN are conveyed to a differential sense amplifier over bit lines BITA and BITNA, respectively. The use of a voltage LSUP that is larger than the voltage for WLA helps provide margin for the read operation.

During a write operation, the latch power supply voltage LSUP is at a non-elevated power supply voltage (e.g., Vcc) and the two address transistors associated with a given port are turned on with an elevated power supply voltage (e.g., Vcchg), so that data may be loaded into the cell (e.g., memory element 24). For example, during a write operation on port B, word line signal WLB is asserted (with Vcchg), which turns on the port B address transistors. The data that is to be loaded into cell 24 is provided by a bit line driver over differential bit lines BITB and BITNB. When the bit lines BITB and BITNB are connected to nodes N1 and N2 by turning on the port B address transistors, the data on lines BITB and BITNB is driven into the memory element 24. For example, if a logic one is being loaded in element 24, node N1 will be driven high (e.g., to Vcc) by a high signal on bit line BITB while node N2 is being pulled low (e.g., to Vss) by a low signal on complementary bit line BITNB. The use of a voltage LSUP that is smaller than the voltage for WLB helps provide margin for the write operation.

Figure 3:
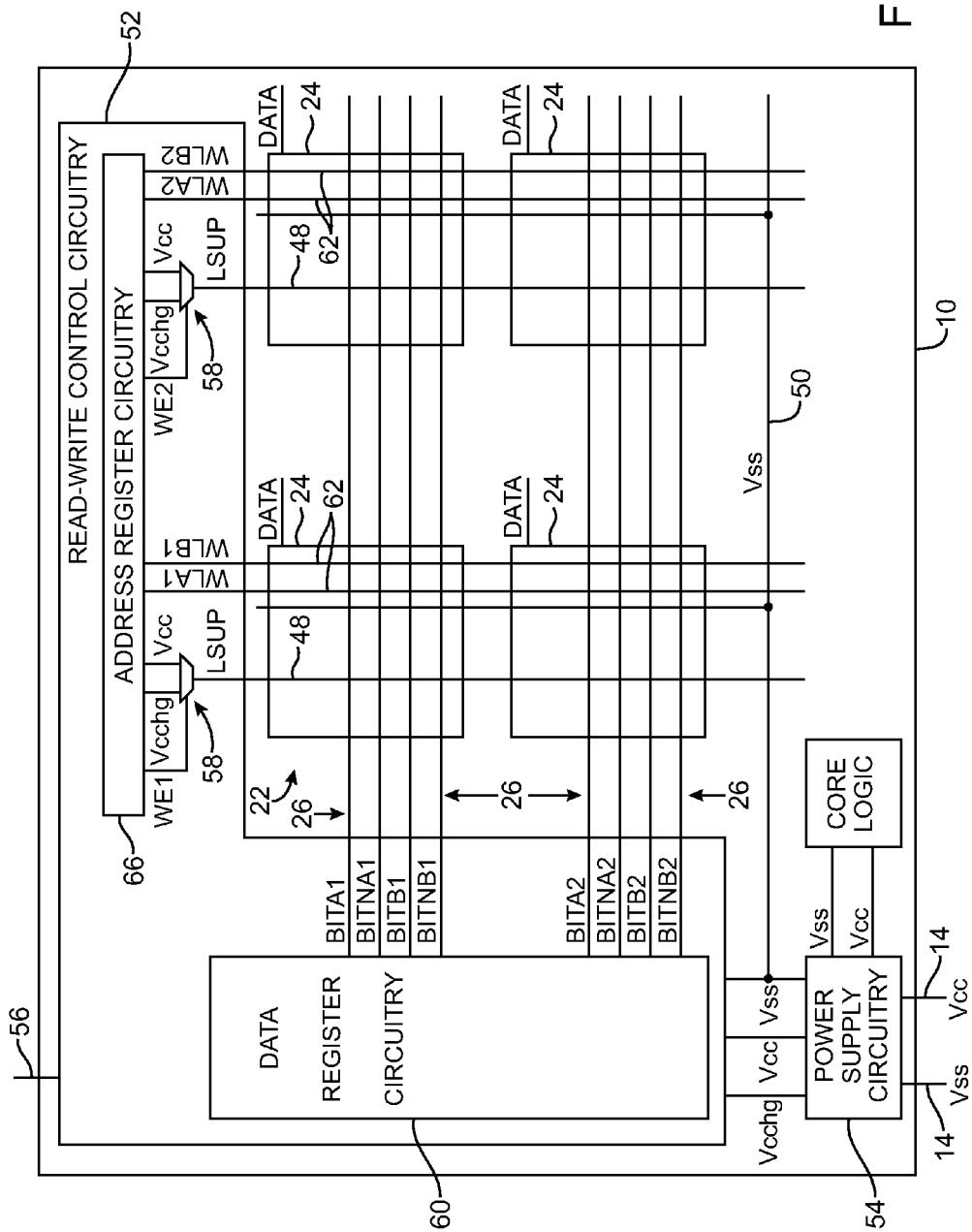
FIG. 3 is a diagram of an illustrative integrated circuit such as a programmable logic device integrated circuit that has an array of memory elements of the type shown in FIG. 2 and associated read and write control circuitry in accordance with an embodiment of the present invention.

When memory elements are arranged in an array, horizontal and vertical conductors and associated loading circuitry may be used to load the memory elements with data and to read data from the memory elements. An illustrative data loading and reading arrangement is shown in FIG. 3. The arrangement of FIG. 3 has a 2×2 array 22 of memory elements 24. (Actual memory arrays typically have hundreds or thousands of rows and columns, but a 2×2 array is used as an example.) The array 22 receives power via latch power supply line 48 and ground power supply line 50.

As shown in FIG. 3, device 10 may receive power supply signals such as positive power supply signals Vcc and ground power supply signal Vss from external sources using input-output pins 14. Positive power supply signal Vcc may have any suitable voltage (e.g., 1.0 volts, a voltage greater than 1.0 volts, a voltage less than 1.0 volts, etc.) Ground power supply signal Vss may have a voltage of 0 volts or other suitable ground signal voltage. If desired, additional power supply voltages may be supplied to device 10. For example, an elevated power supply signal Vcchg may also be provided to device 10 from an external source using input-output pins 14. Elevated power supply voltages may also be generated internally based on externally received voltages. As an example, on-chip voltage divider circuitry, charge power circuitry, or other power regulator circuitry may be used in generating suitable power supply voltages.

Memory array read and write control circuitry 52 may be used to control operations such as data loading and data reading operations. Read-write control circuitry 52 may include power supply circuitry 54. Power supply circuitry 54 may receive power supply voltages such as power supply voltages Vss and Vcc and may produce elevated power supply signals such as Vcchg and core logic power supply signals Vcc (or may receive Vcchg from an external source). With one suitable arrangement, a ground power supply voltage equal to Vss and a positive power supply voltage equal to Vcc may be used as core logic power supply voltages for core logic on device 10 (e.g., core programmable logic 18). The ground power supply voltage (Vss), the positive power supply voltage (Vcc), and an elevated power supply voltage equal to Vcchg (and greater than Vcc) may be used as power supply voltages for memory elements 24 (and array 22) and read-write control circuitry 52.

Data may be provided to data register circuitry 60 via path 56 (e.g., from an external source or from programmable logic 18). This data may then be provided to array 22 via bit lines 26. In the example of FIG. 3, two sets of bit lines are shown, because there are two corresponding rows of memory elements 24. This is merely illustrative. There may be any suitable number of rows of memory elements 24 in array 22 and any suitable number of bit lines 26. Any suitable word size may be used when accessing array 22 (e.g., 8 bit words, 16 bit words, etc.).

Multiplexers 58 may be used to provide a latch power supply signal to a corresponding one of the columns of memory elements 24 in array 22. Each multiplexer 58 may provide its corresponding column with either the elevated power supply signal Vcchg or the non-elevated power supply signal Vcc. Each multiplexer 58 may be controlled by an associated write enable signal WE. The write enable signals (e.g., WE1, WE2, etc.) may be used to selectively power the memory elements 24 of a particular column with either the elevated or non-elevated power supply signal depending on the desired operation of the memory elements 24 in that column. For example, during data writing operations on either port A or port B of a memory element 24, a write enable signal may be used to control a multiplexer 58 and direct the multiplexer to supply non-elevated power supply signals Vcc to latch power supply line 48 of the column associated with the memory element 24. When not writing, the write enable signal may be deasserted and multiplexer 58 may be configured to send elevated power supply signals to the memory elements 24 along the latch supply line 48.

During data writing operations, address register circuitry 66 may receive addressing information (e.g., from core logic). In response, address register circuitry 66 may assert a desired write enable signal (e.g., by taking an appropriate one of signals WE1 or WE2 to a logic high value). When a write enable signal is asserted, a corresponding multiplexer such as multiplexer 58 may supply latch power supply line 48 with non-elevated power supply signals Vcc (rather than elevated power supply signals Vcchg). The non-elevated power supply signals may increase the reliability of write operations by temporarily decreasing the strength of the cross-coupled inverters 34 and 40.

During data writing operations and in response to addressing information, address register circuitry 66 may also assert a desired one of the word lines 62 (e.g., by taking an appropriate one of signals WLA1, WLB1, WLA2, or WLB2 to a logic high value). When a word line signal on a word line is asserted in a given column during data loading operations, the data on the corresponding bit lines 26 may be loaded into the memory elements 24 in that column.

During data reading operations, address register circuitry 66 may receive addressing information. In response, address register circuitry may leave a desired write enable signal deasserted so that the latch power supply line 48 is at the elevated power supply voltage Vcchg. The elevated power supply signals may increase the reliability of read operations by increasing the strength and stability of cross-coupled inverters 34 and 40 as they drive signals onto bit lines.

During data reading operations and in response to addressing information, address register circuitry 66 may assert a desired one of the word lines 62. When a word line signal on a word line is asserted in a given column during data reading operations, data on the corresponding bit lines 26 may be read from memory elements 24 in that column.

Figure 4:
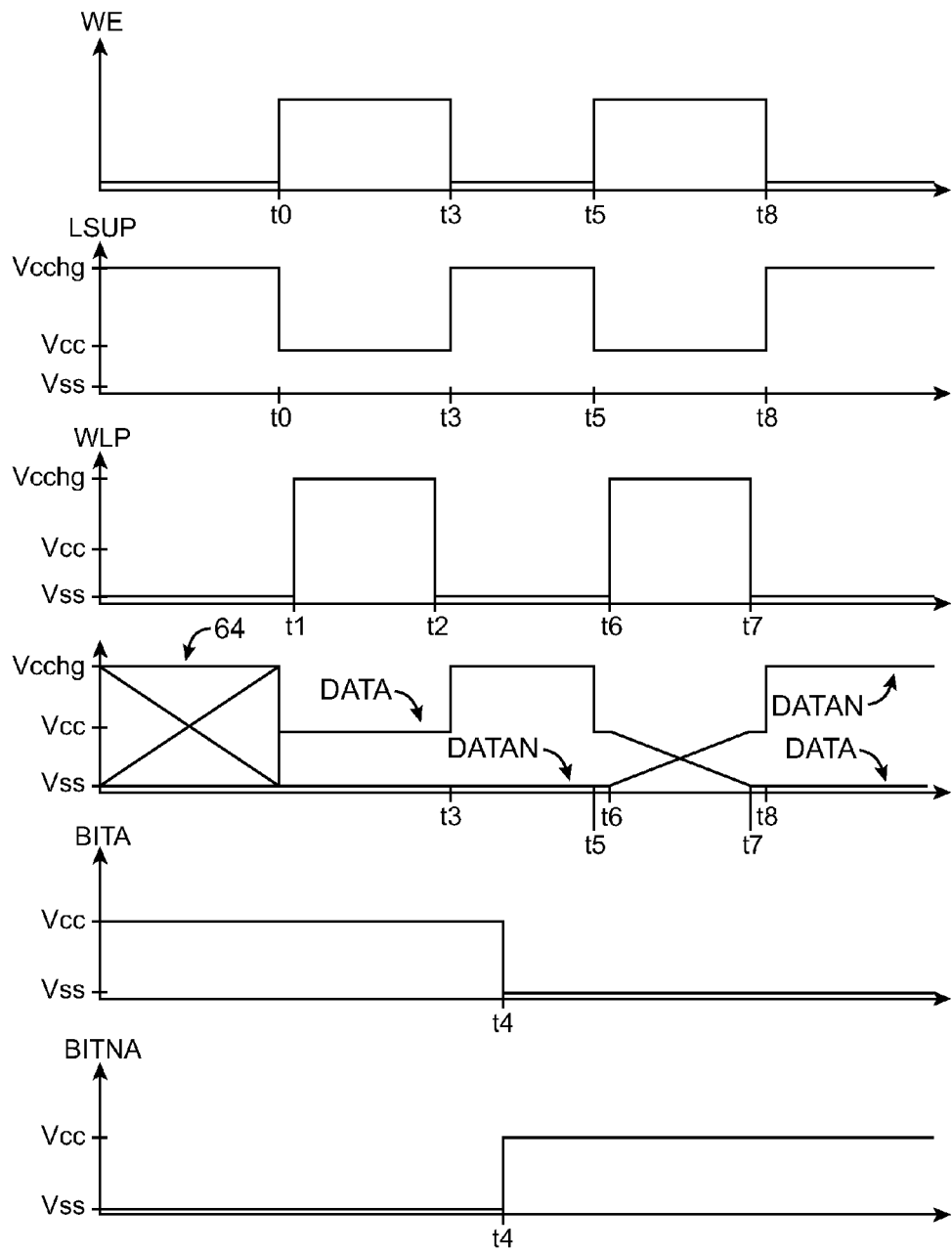
FIG. 4 shows graphs of illustrative signal voltages involved with writing data into memory elements of the type shown in FIG. 2 in accordance with an embodiment of the present invention.

FIG. 4 shows graphs of illustrative signals that may be involved with writing data into memory elements 24 of the type shown in FIG. 2. In the example of FIG. 4, data is being written into a memory element 24 by read-write control circuitry 52. Either a logic one or a logic zero may be stored in memory element 24. When a logic one is stored in memory element 24, the voltage at node N1 is high and the voltage at node N2 is low. When a logic zero is stored in memory element 24, the voltage at node N1 is low and the voltage at node N2 is high. Before time t0 the state of memory element 24 and, therefore, the state of DATA and DATAN may not be known as indicated by box 64 in the fourth trace of FIG. 4.

Between times t0 and t3, data may be loaded into memory element 24. In preparation for data loading operations, data may be loaded into data register circuitry 60. Data register circuitry 60 and address register circuitry 66 of control circuitry 52 may then be used to load this data into the memory elements.

Address register circuitry may assert a write enable signal WE at time t0. When write enable signal WE is asserted, multiplexer 58 may switch the latch power supply signal LSUP from the elevated power supply signal Vcchg to the non-elevated power supply signal Vcc, as shown in the second trace of FIG. 4. By reducing the voltage on the latch power supply line, device 10 may prepare memory element 24 for data writing operations.

To load a logic one through port A, data register circuitry takes bit line BITA high and bit line BITNA low, as indicated in the fifth and sixth traces of FIG. 4. With BITA high and BITNA low, a word line signal may be asserted on word line WLA (e.g., using the elevated power supply signal Vcchg). As shown in the third trace of FIG. 4, word line signal WLA may be asserted by taking the word line WLA to the elevated power supply voltage Vcchg at time t1. When the word line WLA is taken high in this way, the address transistors 46 corresponding to port A are turned on. This electrically connects lines 26 of port A to nodes N1 and N2.

Between times t1 and t2, data register circuitry 60 may drive signals onto memory element 24. For example, the logic one of bit line BITA may be driven onto DATA and the low signal of bit line BITNA may be driven onto DATAN. At time t2, word line signal WLA is deasserted to complete the data writing process. At time t3, write enable signal WE is taken low so that the latch power supply voltage LSUP returns to the level of the elevated power supply voltage Vcchg. As LSUP rises, the logic high value stored on DATA increases from the non-elevated voltage Vcc to the elevated voltage Vcchg as shown in the fourth trace of FIG. 4.

Because the elevated power supply signal Vcchg is used to turn on the address transistors 46 and the latch power supply is at the non-elevated power supply voltage Vcc, data writing operations may be performed reliably without increasing the size (and strength) of the address transistors 46. This allows the size of transistors 46 to be minimized. Because the address transistors are turned on by a voltage signal that is higher than the voltage used to power the cross-coupled inverters 34 and 40, the address transistors 46 can overcome transistors 36, 38, 42, and 44 even if transistors 36, 38, 42, 44, and 46 are all similarly sized (e.g., of similar strength). Because transistors 46 do not have to be stronger (and therefore larger) than the transistors in the cross-coupled inverters, memory element 24 may be considered to be balanced as all of the transistors may be of similar size. Consequently, the overall size (e.g., pitch) of memory elements 24 may be reduced compared to the size of conventional memory elements.

When it is desired to load a logic zero into memory element 24, bit lines BITA and BITNA may be taken low and high, respectively. For example, bit line BITA may be taken low and bit line BITNA may be taken high at time t4.

Address register circuitry may assert a write enable signal WE at time t5 to reduce the latch power supply voltage LSUP to the non-elevated power supply voltage Vcc. Address register circuitry may assert a word line signal on word line WLA at time t6 to turn on address transistors 46 corresponding to the port that data over which data is being written onto element 24 (e.g., port A). When the address transistors 46 are turned on, bit lines BITA and BITNA may be electrically connected to the inverters 34 and 40 and data register circuitry may drive the signals of BITA and BITNA onto element 24 (e.g., onto nodes N1 and N2, respectively).

In the example of FIG. 4, a logic zero is being loaded onto memory element 20 between times t6 and t7 to overwrite the logic one that memory element 20 was previously loaded with. As illustrated in the fourth trace of FIG. 4, DATA may be pulled low and DATAN may be driven high between times t6 and t7 as data register circuitry drives a logic zero onto memory element 24 over bit lines BITA and BITNA. At time t7, word line signal WLA is deasserted to complete the data writing process. At time t8, write enable signal WE is taken low so that the latch power supply voltage LSUP returns to the level of the elevated power supply voltage Vcchg (e.g., multiplexer 58 is directed to pass Vcchg onto latch supply lines 48).

Figure 5:
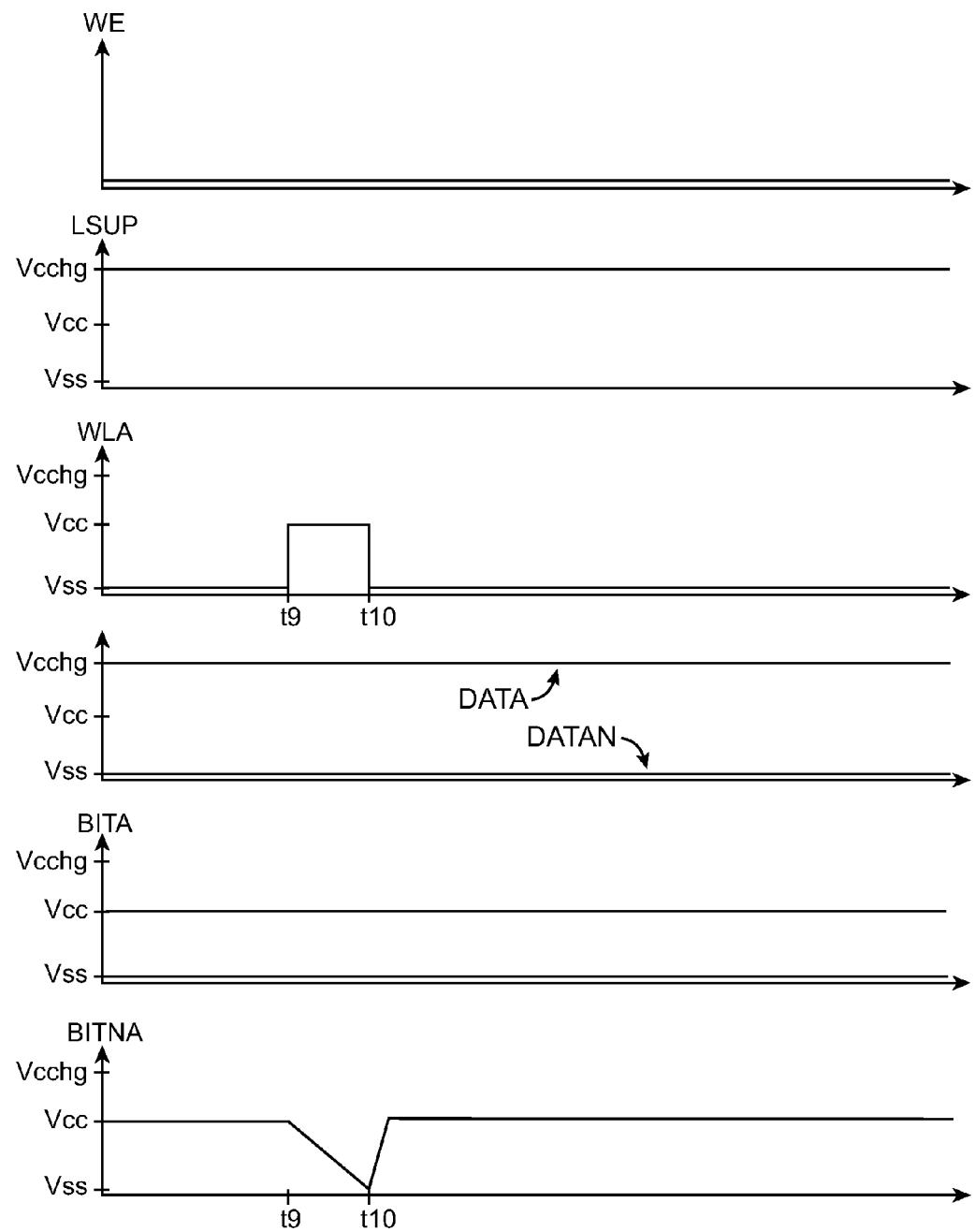
FIG. 5 shows graphs of illustrative signal voltages involved with reading data from memory elements of the type shown in FIG. 2 in accordance with an embodiment of the present invention.

FIG. 5 shows graphs of illustrative signals that may be involved with reading data from memory elements 24 of the type shown in FIG. 2. During data reading operations, the write enable signal WE remains low (is deasserted) and the latch power supply signal LSUP remains at the elevated power supply voltage Vcchg.

In the example of FIG. 5, the data stored in memory element 24 is being read by read-write control circuitry 52. In the read operation illustrated by FIG. 5, memory element 24 is being used to store a logic one (e.g., node N1 is high and node N2 is low) and port A is being used to read the logic one from the memory element. This is merely an illustrative example.

Prior to data reading operations (e.g., before time t9), bit lines BITA and BITNA may be precharged. For example, bit lines BITA and BITNA may be precharged when data register circuitry 60 drives the positive power supply voltage Vcc onto the bit lines before data reading operations. During data reading operations (e.g., between times t9 and t10), the precharging circuitry of data register circuitry 60 may weakly hold bit lines BITA and BITNA at Vcc.

Between times t9 and t10, word line signal WLA may be asserted. The word line signal WLA may be taken to the level of the non-elevated positive power supply voltage Vcc so that the address transistors 46 are relatively weak when compared with the transistors of inverters 34 and 40 (which are powered with Vcchg). The relative weakness of the address transistors 46 helps to ensure that read operations are reliable and do not cause memory element 24 to flip states undesirably.

In the FIG. 5 example, when the word line signal WLA is asserted, the address transistor associated with bit line BITNA (which is associated with node N2) is turned on while the address transistor associated with bit line BITA remains turned off. The address transistor associated with bit line BITA remains off because the voltage on its gate terminal (e.g., Vcc) is lower than the voltage on node N1 (e.g., Vcchg). Therefore, bit line BITA remains at its precharged level during the illustrative reading operation of FIG. 5. Bit line BITNA may be coupled to DATAN (e.g., node N2) as its associated address transistor is turned on when word line WLA is asserted.

Between times t9 and t10, inverter 40 may pull bit line BITNA low as illustrated in the last trace of FIG. 5. As bit line BITNA is pulled low, a sense amplifier in data register circuitry 60 may detect the low voltage of bit line BITNA and may generate a corresponding digital signal that indicates the state of the memory element (e.g., the data stored in memory element 24). The data of memory element 24 may then be used in device 10 or sent to an external device over path 56. At time t10, word line signal WLA may be deasserted to complete data reading operations.

Figure 6:
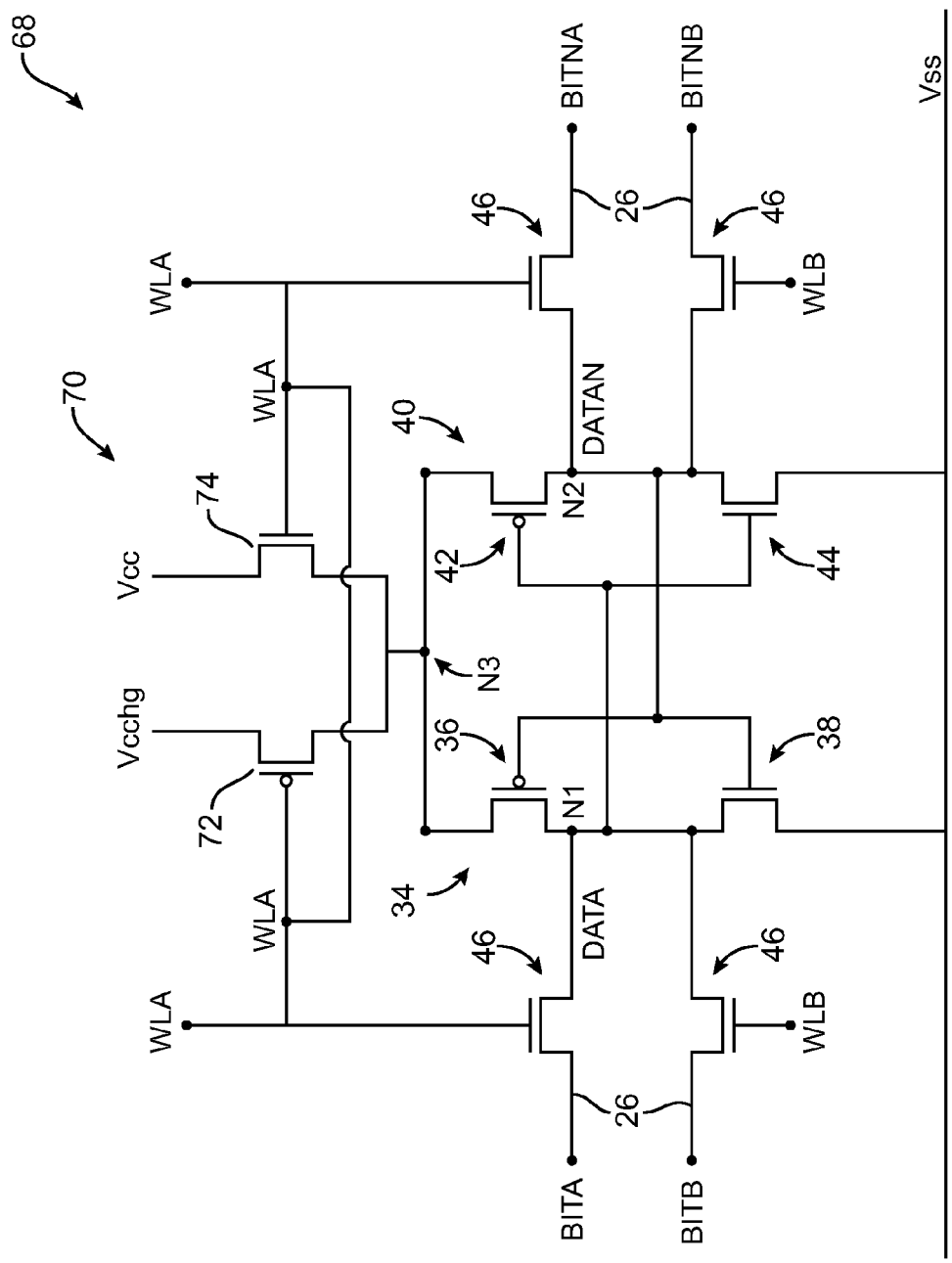
FIG. 6 is a diagram of an illustrative memory element with illustrative voltage-selecting power supply circuitry in accordance with an embodiment of the present invention.

Another illustrative memory element 68 of the type that may be used in an array of memory elements such as array 22 in accordance with an embodiment of the present invention is shown in FIG. 6. Memory element 68 may have many of the properties and features of memory element 24 (FIG. 2) except with regard to how the cross-coupled inverters in each memory element receive power supply signals (e.g., whether through LSUP of element 24 or through circuitry 70 of element 68).

As shown in FIG. 6, memory element 68 may be formed from two cross-coupled inverters such as inverters 34 and 40. Inverter 34 has p-channel metal-oxide-semiconductor (PMOS) transistor 36 and n-channel metal-oxide-semiconductor (NMOS) transistor 38. Inverter 40 has PMOS transistor 42 and NMOS transistor 44. The inverters 34 and 40 are powered by latch power supply circuit 70.

The latch power supply circuit 70 may provide appropriate power supply signals for inverters 34 and 40 depending on the operation of memory element 68. For example, during data reading operations, circuit 70 may provide elevated power supply signals (e.g., Vcchg) to inverters 34 and 40. During data writing operations, circuit 70 may provide non-elevated power supply signals (e.g., Vcc) to inverters 34 and 40.

When not addressing element 68, the word line signal on word line WLA may be deasserted. When the word line WLA is at the ground power supply voltage Vss (e.g., word line signal is deasserted), transistor 72 may be turned on and transistor 74 may be turned off so that the voltage at node N3 is Vcchg. Because transistor 72 is a PMOS transistor and transistor 74 is an NMOS transistor, the transistor 72 will be turned on and the transistor 74 will be turned off when the voltage on word line WLA is Vss. Latch power supply circuitry 70 may therefore provide elevated power supply signals (e.g., Vcchg) to inverters 34 and 40.

During data reading operations using port A, the non-elevated power supply voltage Vcc is asserted on word line WLA. Circuitry 70 may therefore provide elevated power supply signals (e.g., Vcchg) to inverters 34 and 40. During data reading operations using port B, word line WLA may be at Vss or Vcc and word line WLB may be used to turn on the transistors 46 associated with port B (e.g., by asserting Vcc onto WLB). When the word line WLA is at Vcc (or Vss), transistor 72 may be turned on and transistor 74 may be turned off so that the voltage at node N3 is Vcchg (e.g., because transistor 72 is a PMOS transistor and transistor 74 is an NMOS transistor).

During data writing operations using port A or port B, the elevated power supply voltage Vcchg is asserted on word line WLA and, consequently, circuitry 70 will provide non-elevated power supply signals (e.g., Vcc) to inverters 34 and 40. When the voltage on word line WLA is Vcchg, transistor 72 will be turned off and transistor 74 will be turned on such that the voltage at node N3 is Vcc (e.g., because transistor 72 is a PMOS transistor and transistor 74 is an NMOS transistor). When port A is used for write operations, asserting Vcchg onto WLA will not only properly control circuitry 70 but will also couple BITA and BITNA to DATA and DATAN, respectively, through the transistors 46 associated with port A. When port B is used for write operations, Vcchg may be asserted onto both word lines WLA and WLB so that circuitry 70 selects the proper power supply voltage and so that the transistors 46 associated with port B are turned on.

Memory cell 68 has four associated bit lines 26. During read operations through port A, data is read out of memory cell 68 over bit lines BITA and BITNA and is sensed using associated differential sense amplifier circuitry. During write operations through port A, data on bit lines BITA and BITNA is loaded into memory cell 68. Similarly, data is read out of memory cell 68 over bit lines BITB and BITNB during read operations through port B. During write operations through port B, data on bit lines BITB and BITNB is loaded into memory cell 68.

Memory cell 68 has four address transistors 46. One pair of address transistor 46 is controlled by the word line for port A (WLA) and is associated with port A. The other pair of address transistors 46 is controlled by the word line for port B (WLB) and is associated with port B. When WLA is asserted, the gates of the port A address transistor go high and the port A address transistors may be turned on. With the port A transistors turned on, the bit lines BITA and BITNA may be connected to nodes N1 and N2, respectively. When WLB is asserted, the gates of the port B address transistors go high and the port B address transistors may be turned on. With the port B address transistors turned on, the bit lines BITB and BITNB may be connected to nodes N1 and N2, respectively.

As shown in FIG. 6, the signal on node N1 is labeled "DATA" and represents the contents of memory cell 68, whereas the signal on node N2 is labeled "DATAN" and represents the inverse of the signal DATA. When a logic one is stored in cell 68, node N1 is high (e.g., at the voltage of node N3) and node N2 is low (e.g., Vss). When a logic zero is stored in cell 68, node N1 is low (e.g., Vss) and node N2 is high (e.g., at the voltage of node N3).

During a read operation, node N3 is at an elevated power supply voltage (e.g., Vcchg) and the two address transistors associated with a given port are turned on by a non-elevated power supply voltage (e.g., Vcc), so that the contents of the cell may be sensed over a differential bit line pair 26. The two address transistors may be turned on when word line signal WLA (or WLB) is asserted with the non-elevated power supply voltage (e.g., Vcc). For example, during a read operation on port A, word line signal WLA is asserted with voltage Vcc, which turns on the port A address transistors, so that signals DATA and DATAN are conveyed to a differential sense amplifier over bit lines BITA and BITNA, respectively.

During a write operation, node N3 is at a non-elevated power supply voltage (e.g., Vcc) and the two address transistors associated with a given port are turned on with an elevated power supply voltage (e.g., Vcchg), so that data may be loaded into the cell (e.g., memory element 68). The two address transistors may be turned on when word line signal WLA is asserted with the elevated power supply voltage (e.g., Vcchg). For example, during a write operation on port B, word line signal WLB is asserted (with Vcchg), which turns on the port B address transistors. The data that is to be loaded into cell 68 is provided by a bit line driver over differential bit lines BITB and BITNB. When the bit lines BITB and BITNB are connected to nodes N1 and N2 by turning on the port B address transistors, the data on lines BITB and BITNB is driven into the memory element 68. For example, if a logic one is being loaded in element 68, node N1 will be driven high (e.g., to Vcc) by a high signal on bit line BITB while node N2 is being pulled low (e.g., to Vss) by a low signal on complementary bit line BITNB.

Figure 7:
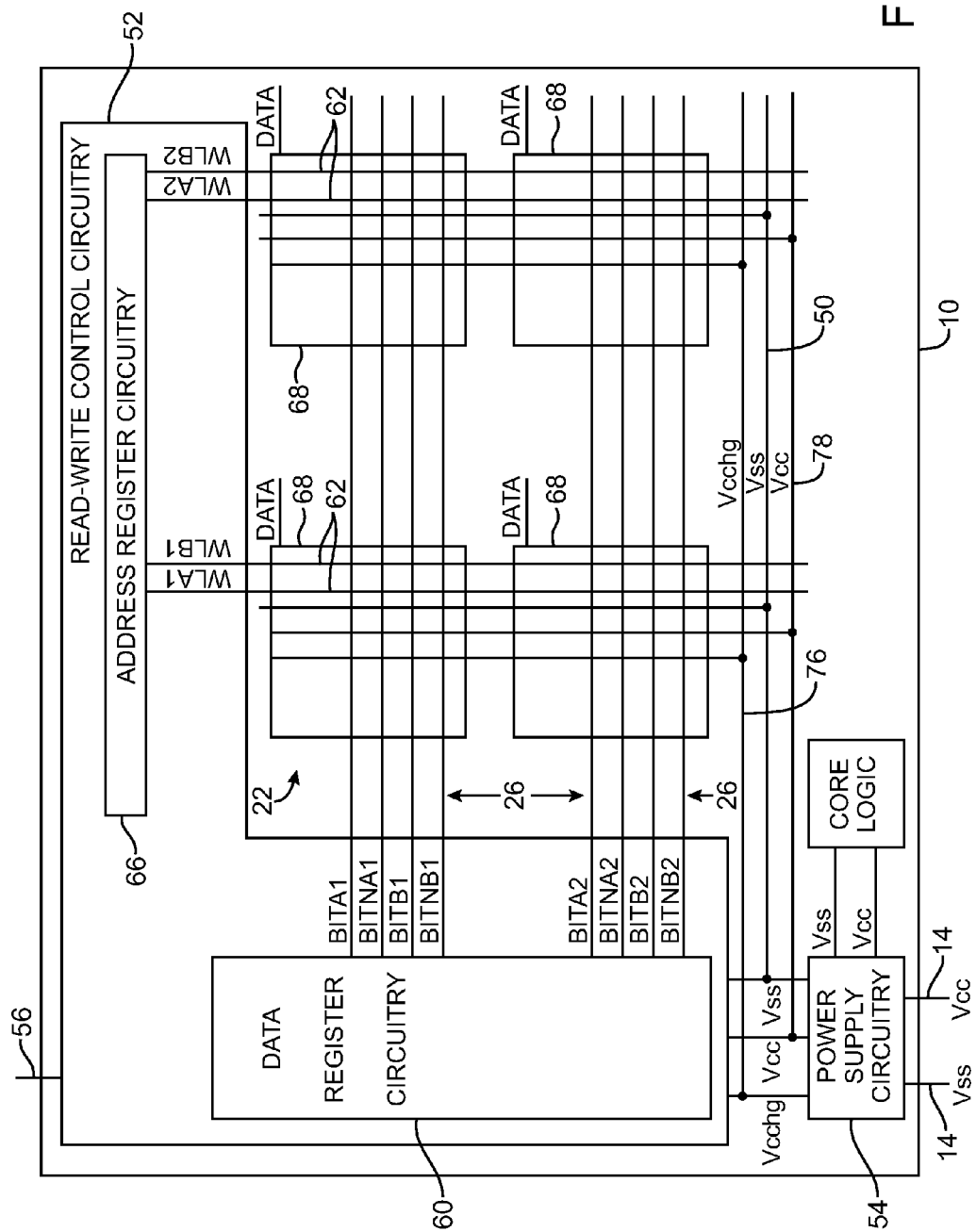
FIG. 7 is a diagram of an illustrative integrated circuit such as a programmable logic device integrated circuit that has an array of memory elements of the type shown in FIG. 6 and associated read and write control circuitry in accordance with an embodiment of the present invention.

An illustrative data loading and reading arrangement is shown in FIG. 7. FIG. 7 illustrates an integrated circuit and associated read and write control circuitry similar to the integrated circuited and associated control circuitry of FIG. 3 but has been modified for use with an array of memory elements of the type shown in FIG. 6. The arrangement of FIG. 7 has a 2×2 array 22 of memory elements 68. (Actual memory arrays typically have hundreds or thousands of rows and columns, but, as with the arrangement of FIG. 3, a 2×2 array is used as an example.) The array 22 receives power via elevated power supply line 76, positive power supply line 78, and ground power supply line 50.

Data may be provided to data register circuitry 60 via path 56 (e.g., from an external source or from programmable logic 18). This data may then be provided to array 22 via bit lines 26. In the example of FIG. 7, two sets of bit lines are shown, because there are two corresponding rows of memory elements 68. This is merely illustrative. There may be any suitable number of rows of memory elements 68 in array 22 and any suitable number of bit lines 26. Any suitable word size may be used when accessing array 22 (e.g., 8 bit words, 16 bit words, etc.)

During data writing operations and in response to addressing information (from core logic), address register circuitry 66 may assert a word line signal on a desired one of the word lines 62 (e.g., by taking an appropriate one of signals WLA1, WLB1, WLA2, or WLB2 to a logic high value). When a word line signal on a word line is asserted in a given column during data loading operations, the data on the corresponding bit lines 26 may be loaded into the memory elements 68 in that column. During writing operations on port A or on port B, word line signals associated with port A of a memory element may also be asserted with the elevated voltage Vcchg so that circuitry 70 of FIG. 6 selects the non-elevated voltage Vcc to power inverters 34 and 40.

During data reading operations and in response to addressing information (from core logic), address register circuitry 66 may assert a desired one of the word lines 62. When a word line signal on a word line is asserted in a given column during data reading operations, data on the corresponding bit lines 26 may be read from memory elements 68 in that column.

Figure 8:
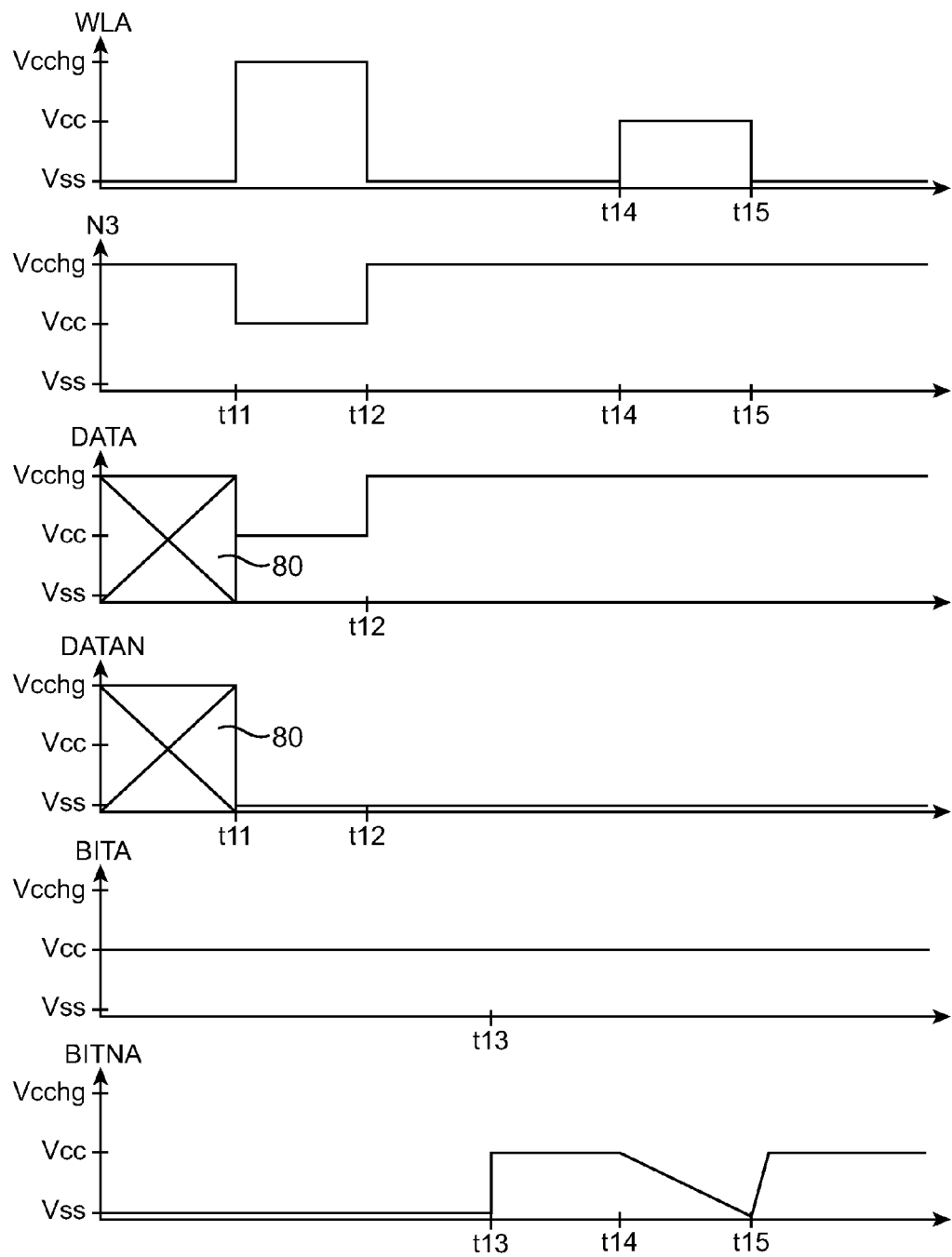
FIG. 8 shows graphs of illustrative signal voltages involved with using a first port (port A) to write data into and read data from memory elements of the type shown in FIG. 6 in accordance with an embodiment of the present invention.

FIG. 8 shows graphs of illustrative signals that may be involved with using port A to write data into and read data from memory elements 68 of the type shown in FIG. 6. In the example of FIG. 8, a logic one is being written into and then read from a memory element 68 through port A by read-write control circuitry 52. In general, either a logic one or a logic zero may be stored in memory element 68. When a logic one is stored in memory element 68, the voltage at node N1 is high and the voltage at node N2 is low. When a logic zero is stored in memory element 68, the voltage at node N1 is low and the voltage at node N2 is high. Before time t11 the state of memory element 68 and, therefore, the state of DATA and DATAN may not be known as indicated by boxes 80 in the third and fourth traces of FIG. 8.

Between times t11 and t12, data may be loaded into memory element 68. In preparation for data loading operations, data may be loaded into data register circuitry 60. Data register circuitry 60 and address register circuitry 66 of control circuitry 52 may then be used to load this data into the memory elements.

To load a logic one through port A, data register circuitry 60 takes bit line BITA high and bit line BITNA low, as indicated in the fifth and sixth traces of FIG. 8. With BITA high and BITNA low, word line signal WLA may be asserted (e.g., with the elevated power supply signal Vcchg). As shown in the first trace of FIG. 8, word line signal WLA may be asserted by taking signal WLA to the elevated power supply voltage Vcchg at time t11. When word line signal WLA is taken high in this way, the address transistors 46 corresponding to port A are turned on. This electrically connects lines 26 of port A to nodes N1 and N2.

When the word line signal WLA is taken to the elevated power supply voltage, the voltage at node N3 is reduced from Vcchg to Vcc (e.g., as indicated in the second trace of FIG. 8 between times t11 and t12). The reduction in voltage at node N3 occurs as the word line signal WLA at Vcchg is applied to the gates of transistors 72 and 74. When the gates of transistors 72 and 74 are at Vcchg, transistor 72 will be turned off and transistor 74 will be turned on. The lower voltage Vcc on node N3 may reduce the strength of the cross-coupled inverters 34 and 40 and, therefore, improve the reliability of data writing operations.

Between times t11 and t12, data register circuitry 60 may drive signals onto memory element 68. For example, the logic one of bit line BITA may be driven onto DATA and the low signal of bit line BITNA may be driven onto DATAN. At time t12, word line signal WLA is deasserted to complete the data writing process. When word line signal WLA is deasserted, the voltage on node N3 will return to the elevated voltage Vcchg (e.g., because transistor 72 is turned on and transistor 74 is turned off).

Because the elevated power supply signal Vcchg is used to turn on the address transistors 46 and the cross-coupled inverters 34 and 40 are powered with the non-elevated power supply voltage Vcc during data writing operations, data writing operations may be performed reliably without increasing the size (and strength) of the address transistors 46. Because the address transistors are turned on by a voltage signal that is higher than the voltage used to power the cross-coupled inverters 34 and 40, the address transistors 46 can overcome the transistors of inverters 34 and 40 even if these transistors are similar in size and strength to address transistors 46. Because transistors 46 do not have to be stronger (and therefore larger) than the transistors in the cross-coupled inverters, memory element 68 may be considered to be balanced as all of the transistor sizes may be identical. Consequently, the overall size (e.g., pitch) of memory element 68 may be reduced compared to the size of conventional memory elements.

At time t13, read-write control circuitry 52 may switch from data writing operations to data reading operations. In the example of FIG. 8, the data that was written into memory element 68 is being read by read-write control circuitry 52. In the read operation illustrated in FIG. 8, memory element 68 contains a logic one (e.g., node N1 is high and node N2 is low) and port A is being used to read the logic one from the memory element. This is merely an illustrative example.

Prior to data reading operations (e.g., before time t14), bit lines BITA and BITNA may be precharged. For example, bit lines BITA and BITNA may be precharged at time t13 when data register circuitry 60 drives the positive power supply voltage Vcc onto the bit lines in preparation for data reading operations. During data reading operations (e.g., between times t14 and t15), the data register circuitry 60 may weakly hold bit lines BITA and BITNA at Vcc.

Between times t14 and t15, word line signal WLA may be asserted. The word line signal WLA may be taken to the level of the non-elevated positive power supply voltage (e.g., Vcc). With the word line signal WLA at the non-elevated voltage Vcc, transistor 72 will be turned on and transistor 74 will be turned off so that the voltage on node N3 will be Vcchg (e.g., as indicated in the second trace of FIG. 8 between times t14 and t15). When the address transistors are turned on by the non-elevated voltage Vcc and node N3 is at Vcchg, the address transistors 46 are relatively weak when compared with the transistors of inverters 34 and 40. The relative weakness of the address transistors 46 helps to ensure that read operations are reliable and that a read operation does not cause memory element 68 to flip states undesirably.

In the FIG. 8 example when the word line signal WLA is asserted between times t14 and t15, the address transistor associated with bit line BITNA (e.g., associated with node N2) is turned on while the address transistor associated with bit line BITA remains turned off. The address transistor associated with bit line BITA remains off because the voltage on its gate terminal (e.g., Vcc) is lower than the voltage on node N1 (e.g., Vcchg) and equal to the voltage on BITA (e.g., Vcc). Therefore, bit line BITA remains at its precharged level during the illustrative reading operation of FIG. 8. Bit line BITNA may be coupled to DATAN (e.g., node N2) as its associated address transistor is turned on when word line WLA is asserted with a signal at the non-elevated voltage Vcc (e.g., because the voltage on BITNA is Vss).

Between times t14 and t15, inverter 40 may pull bit line BITNA low as illustrated in the last trace of FIG. 8. As bit line BITNA is pulled low, a sense amplifier in data register circuitry 60 may detect the low voltage of bit line BITNA and generate a digital signal that indicates the state of the memory element (e.g., the data stored in memory element 68). The data of memory element 68 may then be used in device 10 or sent to an external device over path 56. At time t15, word line signal WLA may be deasserted to complete data reading operations.

Figure 9:
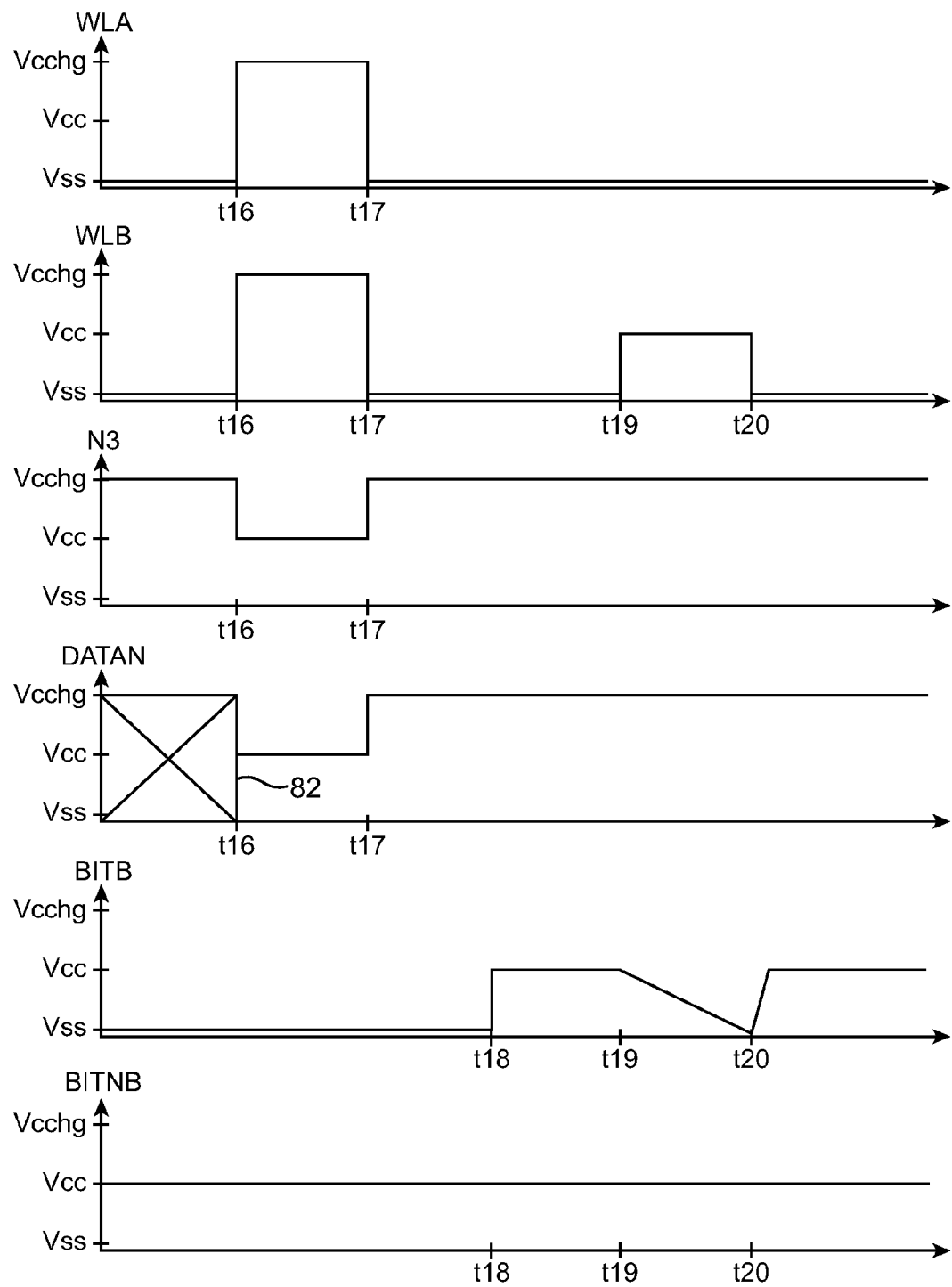
FIG. 9 shows graphs of illustrative signal voltages involved with using a second port (port B) to write data into and read data from memory elements of the type shown in FIG. 6 in accordance with an embodiment of the present invention.

FIG. 9 shows graphs of illustrative signals that may be involved with using port B to write data into and read data from memory elements 68 of the type shown in FIG. 6. In the example of FIG. 9, a logic zero is being written into and then read from a memory element 68 through port B by read-write control circuitry 52. Before time t16 the state of memory element 68 and, therefore, the state of DATA (and DATAN) may not be known as indicated by box 82 in the fourth trace of FIG. 9.

Between times t16 and t17, data may be loaded into memory element 68. To load a logic zero through port B, data register circuitry takes bit line BITB low and bit line BITNB high, as indicated in the fifth and sixth traces of FIG. 9. With BITB low and BITNB high, word line signals may be asserted on word lines WLA and WLB (e.g., using the elevated power supply signal Vcchg).

When the word line signal WLA is taken to the elevated power supply voltage, the voltage at node N3 is reduced from Vcchg to Vcc (e.g., as indicated in the third trace of FIG. 9 between times t16 and t17). The reduction in voltage at node N3 occurs as the word line signal WLA at Vcchg is applied to the gates of transistors 72 and 74. When the gates of transistors 72 and 74 are at Vcchg, transistor 72 will be turned off and transistor 74 will be turned on. The lower voltage Vcc on node N3 may reduce the strength of the cross-coupled inverters 34 and 40 and, therefore, improve the reliability of data writing operations.

As shown in the first trace of FIG. 9, word line signal WLB may be asserted by taking signal WLB to the elevated power supply voltage Vcchg at time t16. When word line WLB is taken high in this way, the address transistors 46 corresponding to port B are turned on. This electrically connects lines 26 of port B to nodes N1 and N2.

Between times t16 and t17, data register circuitry 60 may drive signals onto memory element 68. For example, the logic zero of bit line BITB may be driven onto DATA and the high signal of bit line BITNB may be driven onto DATAN. At time t17, word line signals WLB and WLA are deasserted to complete the data writing process. When word line signal WLA is deasserted, the voltage on node N3 will return to the elevated voltage Vcchg (e.g., because transistor 72 is turned on and transistor 74 is turned off).

At time t18, read-write control circuitry 52 may switch from data writing operations to data reading operations. In the example of FIG. 9, the data that was written into memory element 68 is being read by read-write control circuitry 52. In the read operation illustrated by FIG. 9, memory element 68 is being used to store a logic zero (e.g., node N1 is low and node N2 is high) and port B is being used to read the logic zero from the memory element. This is merely an illustrative example.

Prior to data reading operations (e.g., before time t19), bit lines BITB and BITNB may be precharged. For example, bit lines BITB and BITNB may be precharged at time t18 when data register circuitry 60 drives the positive power supply voltage Vcc onto the bit lines before data reading operations. During data reading operations (e.g., between times t19 and t20), the data register circuitry 60 may weakly hold bit lines BITB and BITNB at Vcc.

Between times t19 and t20, word line signal WLB may be asserted on an appropriate word line. The word line signal WLB may be taken to the level of the non-elevated positive power supply voltage (e.g., Vcc). Between times t19 and t20, the word line signal WLA may be deasserted or may be asserted with the non-elevated power supply voltage Vcc (e.g., during simultaneous read operations using port A and port B). The voltage on node N3 is Vcchg during data reading operations using port B as indicated in the third trace of FIG. 9.

When the address transistors associated with port B are turned on by the non-elevated voltage Vcc and node N3 is at Vcchg, the address transistors 46 are relatively weak when compared with the transistors of inverters 34 and 40. The relative weakness of the address transistors 46 helps to ensure that read operations are reliable and that a read operation does not cause memory element 68 to flip states undesirably.

When the word line signal is asserted on word line WLB between times t19 and t20, the address transistor associated with bit line BITNB (e.g., associated with node N2) is turned off while the address transistor associated with bit line BITB is turned on. The address transistor associated with bit line BITNB is turned off because the voltage on its gate terminal (e.g., Vcc) is lower than the voltage on node N2 (e.g., Vcchg) and equal to the voltage on BITNB (e.g., Vcc). Bit line BITNB therefore remains at its precharged level during the illustrative reading operation of FIG. 9. Bit line BITB may be coupled to DATA (e.g., node N1) as its associated address transistor is turned on when word line WLB is asserted with a signal at the non-elevated voltage Vcc.

Between times t19 and t20, inverter 34 may pull bit line BITB low as illustrated in the fifth trace of FIG. 9. As bit line BITB is pulled low, a sense amplifier in data register circuitry 60 may detect the low voltage of bit line BITB and generate a digital signal that indicates the state of the memory element (e.g., the data stored in memory element 68). At time t20, word line signal WLB may be deasserted to complete data reading operations.

Figure 10:
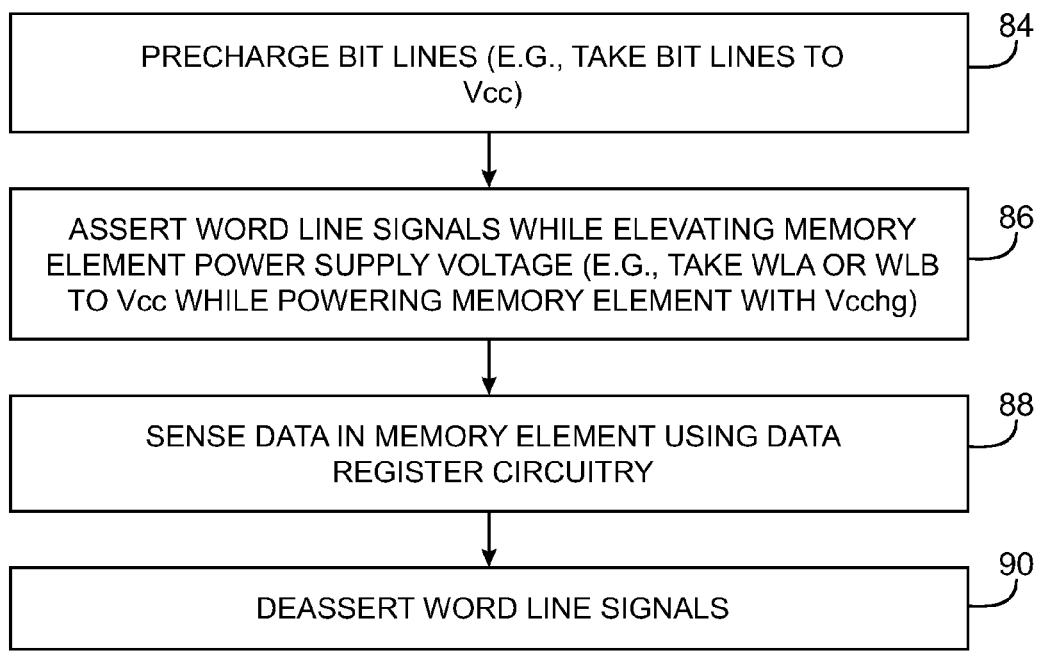
FIG. 10 is a flow chart of illustrative steps involved in reading data from an illustrative memory element in accordance with an embodiment of the present invention.

Illustrative steps involved in reading data from memory elements such as memory elements 24 and 68 are shown in FIG. 10.

At step 84, bit lines 26 corresponding to the port associated with data reading operations may be precharged. The bit lines may be precharged by weakly pulling the signals on the bit lines to the non-elevated voltage Vcc.

At step 86, word line signals may be asserted on the port associated with data reading operations while the memory element's power supply voltage is raised to the elevated voltage Vcchg. The word line signals may be raised to the non-elevated voltage Vcc to turn on the associated address transistors.

At step 88, data register circuitry 60 may sense the data stored in the memory element using data register circuitry. For example, the data register circuitry may sense a voltage drop on a given one of the bit lines of the memory element.

At step 90, the word line signals are deasserted to complete data reading operations.

Figure 11:
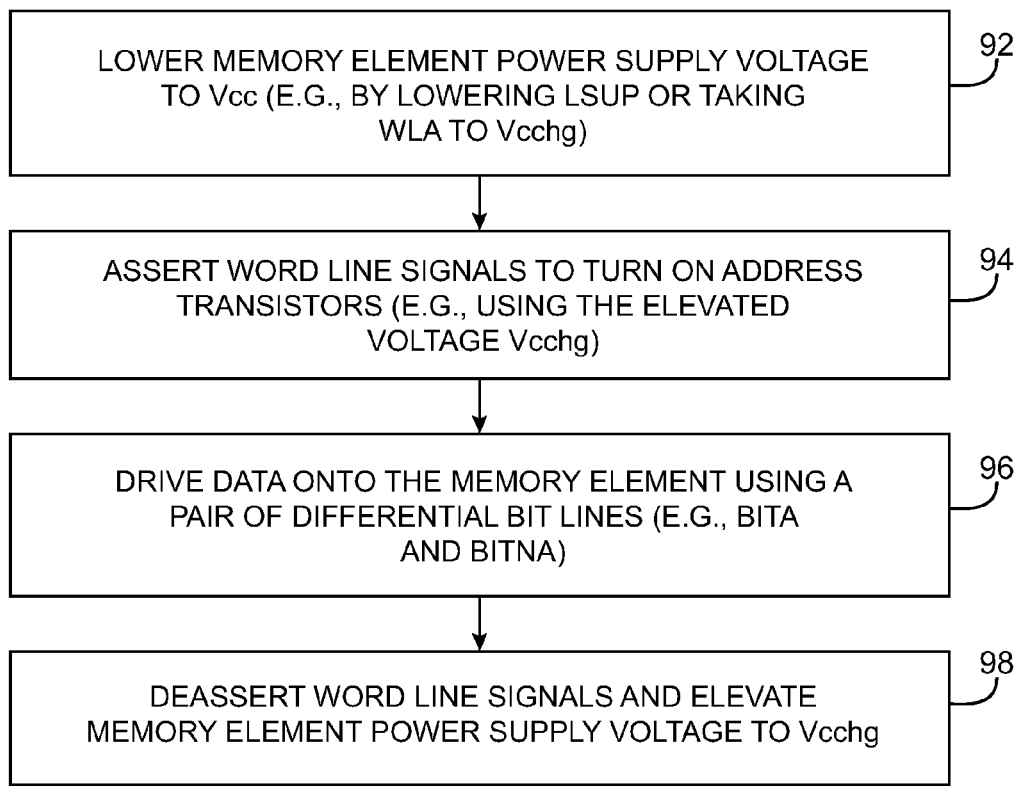
FIG. 11 is a flow chart of illustrative steps involved in writing data into an illustrative memory element in accordance with an embodiment of the present invention.

Illustrative steps involved in writing data into memory elements such as memory elements 24 and 68 are shown in FIG. 11.

At step 92, the memory element's power supply voltage may be lowered to the non-elevated voltage Vcc. For example, the power supply voltage may be lowered using multiplexer 58 or using circuitry 70 of element 68.

At step 94, address register circuitry 66 may assert word line signals to turn on address transistors associated with a given port of the memory element. The address transistors may be turned on when word line signals at the elevated voltage Vcchg are applied to the gates of the address transistors.

At step 96, data register circuitry 60 may drive data signals and inverted data signals onto the memory element over a pair of associated bit lines (e.g., BITA and BITNA).

At step 98, address register circuitry 66 may deassert word line signals and the memory element's power supply voltage may be elevated to Vcchg. For example, the power supply voltage may be elevated using multiplexer 58 or using circuitry 70 of memory element 68.

Figure 12:
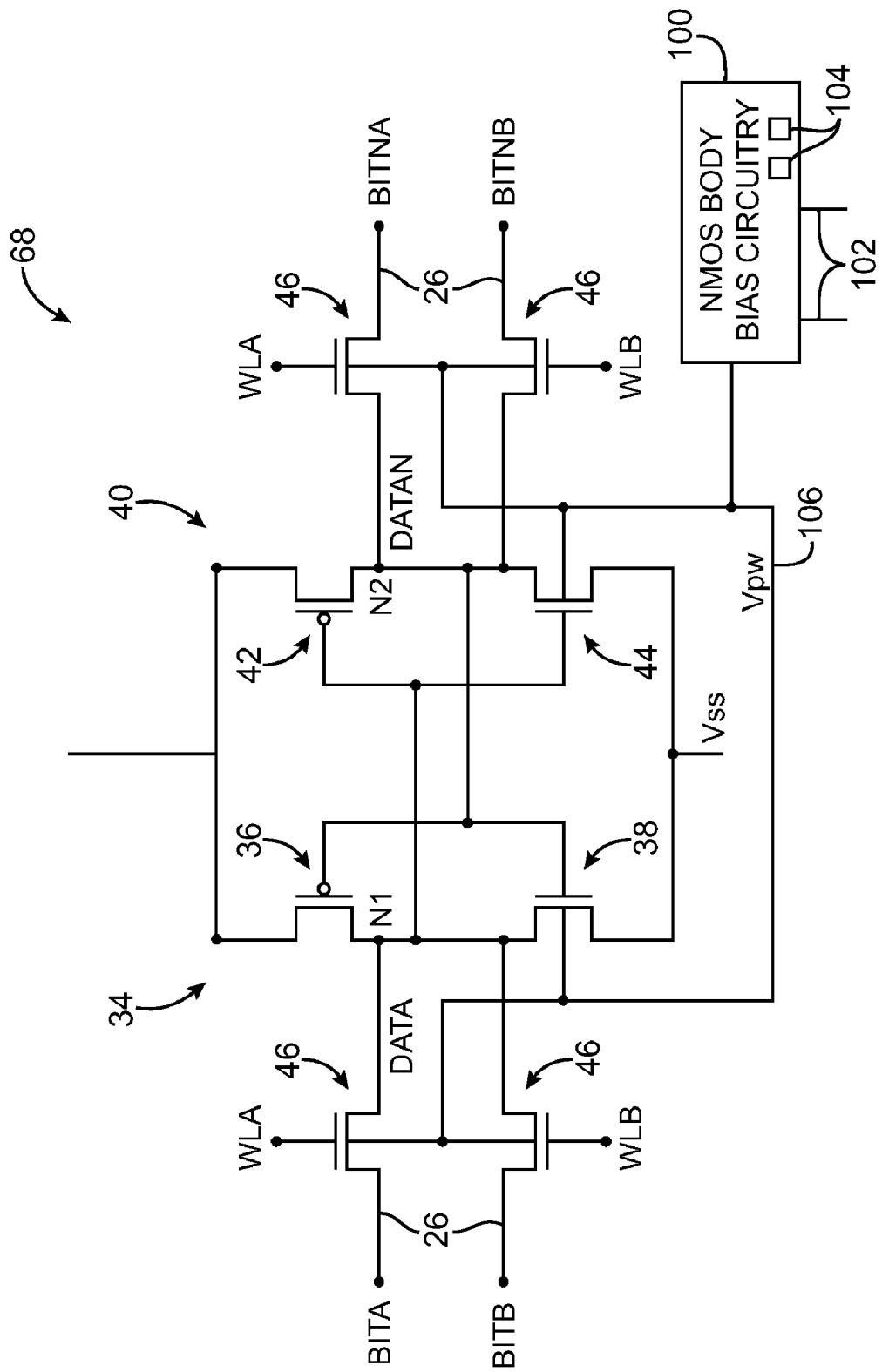
FIG. 12 is a diagram of an illustrative memory element and an illustrative body bias circuit in accordance with an embodiment of the present invention.

FIG. 12 shows how a memory element such as memory elements 24 and 68 may have associated body bias circuitry 100 that generates body bias signals Vpw for the NMOS transistors of the memory element. The body bias signals Vpw may be carried over a body bias signal line 106 to the n-channel metal-oxide-semiconductor transistors in the memory element (e.g., element 24 or 68).

Circuitry 100 (e.g., n-channel body bias generation circuitry 100) may generate negative body bias signals to increase the threshold voltage of NMOS transistors and thereby weaken the NMOS transistors. The body bias signals may be used to reduce leakage that occurs on a precharged bit line during data reading operations. For example, if NMOS devices are not properly biased a process variation may create excessive leakage conditions that will erroneously pull down a precharged bit line before the read operation is actually performed.

The body bias signals that are generated are preferably not too large (in magnitude) so as to prevent the NMOS transistors from becoming too weak. If the NMOS transistors were to become too weak, an inverter holding a logic zero might not be able to pull down a precharged bit line during read operations.

NMOS body bias circuitry 100 may be adjustable. In this type of arrangement, the magnitude of the body bias signals that are applied to body terminals of the NMOS transistors in the memory element may be adjusted based on dynamic or static control signals. For example, circuitry 100 may generate an adjustable body bias voltage that is applied to the body terminals of transistors 46, 38, and 44. If desired, the body bias signal produced by circuitry 100 may be applied to the body terminal of transistor 74 in memory element 68. The voltage level of the body bias signals Vpw may be configured at any suitable time (e.g., as part of a manufacturing process to compensate for process variations).

Terminals 102 may be used to provide signals to NMOS body bias circuitry 100. For example, terminals 102 may be used to provide power supply signals such as Vcc and Vss, control signals that control the operation of circuitry 100 (e.g., to program circuitry 100 to provide a particular Vpw), or other signals that are used in generating body bias signals Vpw. Terminals 102 may receive signals from external devices or from other portions of device 10.

Circuitry 100 may include elements 104 that are used in programming the operation of the circuitry 100. For example, elements 104 may store data that configures circuitry 100 to provide a particular body bias voltage. Elements 104 may be formed from any suitable memory element structures such as poly-silicon fuses, other non-volatile memory elements, etc. Elements 104 may be configured during manufacturing (as an example).

The foregoing is merely illustrative of the principles of this invention and various modifications can be made by those skilled in the art without departing from the scope and spirit of the invention.

What is claimed is:

1. Circuitry comprising:
   address register circuitry operable to generate a word line signal;
   a word line;
   a plurality of memory elements coupled to the word line, wherein the word line is operable to convey the word line signal to the plurality of memory elements and wherein each of the memory elements of the plurality of memory elements comprises a power supply terminal; and
   switching circuitry operable to selectively couple the power supply terminals of the plurality of memory elements to a first power supply line at a first voltage during memory read operations and to selectively couple the power supply terminals of the plurality of memory elements to a second power supply line at a second voltage during memory write operations, wherein the first voltage is different than the second voltage, wherein the switching circuitry comprises a first transistor and a second transistor in each memory element of the plurality of memory elements, and wherein, in each memory element of the plurality of memory elements, the first transistor of that memory element is:
   coupled between a pair of cross-coupled inverters in that memory element and the first power supply line; and
   operable to be controlled by the word line signal.

2. The circuitry defined in claim 1 wherein, in each memory element of the plurality of memory elements, the second transistor of that memory element is:
   coupled between a pair of cross-coupled inverters in that memory element and the second power supply line; and
   operable to be controlled by the word line signal.

3. The circuitry defined in claim 2 wherein the plurality of memory elements comprise dual port memory elements.

4. The circuitry defined in claim 1 wherein the plurality of memory elements comprise dual port memory elements.

5. The circuitry defined in claim 1 wherein the first voltage is greater than the second voltage.

6. A method comprising:
   generating a word line signal;
   conveying the word line signal over a word line to a plurality of memory elements, wherein each of the memory elements of the plurality of memory elements comprises a power supply terminal;
   during memory read operations, selectively coupling the power supply terminals of the plurality of memory elements to a first power supply line at a first voltage; and
   during memory write operations, selectively coupling the power supply terminals of the plurality of memory elements to a second power supply line at a second voltage, wherein the first voltage is greater than the second voltage and wherein generating the word line signal comprises:

during the memory read operations, generating the word line signal at a voltage approximately equal to the second voltage; and during the memory write operations, generating the word line signal at a voltage approximately equal to the first voltage.

7. The method defined in claim 6 wherein each memory element of the plurality of memory elements comprises a first transistor, a second transistor, and a pair of cross-coupled inverters and wherein selectively coupling the power supply terminals of the plurality of memory elements to the first power supply line at the first voltage during the memory read operations comprises:

in each memory element of the plurality of memory elements, coupling the first power supply line to the pair of cross-coupled inverters of that memory element through the first transistor of that memory element.

8. The method defined in claim 7 wherein selectively coupling the power supply terminals of the plurality of memory elements to the second power supply line at the second voltage during the memory write operations comprises:

in each memory element of the plurality of memory elements, coupling the second power supply line to the pair of cross-coupled inverters of that memory element through the second transistor of that memory element.

9. A method comprising:

generating a word line signal;

conveying the word line signal over a word line to a plurality of memory elements, wherein each of the memory elements of the plurality of memory elements comprises a power supply terminal;

during memory read operations, selectively coupling the power supply terminals of the plurality of memory elements to a first power supply line at a first voltage; and during memory write operations, selectively coupling the power supply terminals of the plurality of memory elements to a second power supply line at a second voltage, wherein the first voltage is greater than the second voltage and wherein each memory element of the plurality of memory elements comprises a first transistor, a second transistor, and a pair of cross-coupled inverters and wherein selectively coupling the power supply terminals of the plurality of memory elements to the first power supply line at the first voltage during the memory read operations comprises:

in each memory element of the plurality of memory elements, coupling the first power supply line to the pair of cross-coupled inverters of that memory element through the first transistor of that memory element.

10. The method defined in claim 9 wherein selectively coupling the power supply terminals of the plurality of memory elements to the second power supply line at the second voltage during the memory write operations comprises:

in each memory element of the plurality of memory elements, coupling the second power supply line to the pair of cross-coupled inverters of that memory element through the second transistor of that memory element.

* * * * *